United States Patent
Dwyer

(10) Patent No.: US 6,768,181 B2
(45) Date of Patent: Jul. 27, 2004

(54) MICRO-MACHINED ELECTROMECHANICAL SENSORS (MEMS) DEVICES

(75) Inventor: Paul W Dwyer, Seattle, WA (US)

(73) Assignee: Honeywell International, Inc., Morristown, NJ (US)

(*) Notice: Subject to any disclaimer, the term of this patent is extended or adjusted under 35 U.S.C. 154(b) by 0 days.

(21) Appl. No.: 10/461,036

(22) Filed: Jun. 13, 2003

(65) Prior Publication Data

US 2003/0196489 A1 Oct. 23, 2003

Related U.S. Application Data

(62) Division of application No. 09/963,142, filed on Sep. 24, 2001, now Pat. No. 6,642,067.
(60) Provisional application No. 60/237,954, filed on Oct. 3, 2000.

(51) Int. Cl.[7] .............................................. H01L 29/84
(52) U.S. Cl. ...................................................... 257/415
(58) Field of Search .......................... 257/415, 417–420, 257/600–602

(56) References Cited

U.S. PATENT DOCUMENTS 6,012,336 A * 1/2000 Eaton et al. .................. 73/754

* cited by examiner

Primary Examiner—Craig A. Thompson
(74) Attorney, Agent, or Firm—Charles J. Rupnick

(57) ABSTRACT

Micro-machined electromechanical sensor (MEMS) devices having feature orientation delicately adjusted after initial formation and installation within the device packaging to trim one or more performance parameters of interest, including modulation, bias and other dynamic behaviors of the MEMS devices.

15 Claims, 5 Drawing Sheets

MICRO-MACHINED ELECTROMECHANICAL SENSORS (MEMS) DEVICES

This application is a Divisional of co-pending allowed application Ser. No. 09/963,142, filed on Sep. 24, 2001, now U.S. Pat. No. 6,642,067, which claims the benefit of U.S. Provisional Application Ser. No. 60/237,954, filed in the name of Paul W. Dwyer on Oct. 3, 2000, the complete disclosure of which is incorporated herein by reference.

FIELD OF THE INVENTION

The present invention relates generally to methods for manufacturing micromachined electromechanical sensor (MEMS) devices, and in particular to methods for compensating cumulative variations during processing.

BACKGROUND OF THE INVENTION

The manufacture of MEMS devices, such as accelerometers or rate sensors, is generally well-known and includes many individual processes. Each of the individual processes is a source of variation. The variations of the individual processes accumulate in significant performance differences between different devices manufactured using the same processes in the same way.

One means of coping with this cumulative variation is to control each of the processes in a serial manner to the degree necessary to maintain the cumulative variation within predetermined design parameters. Such process control can, however, be extremely time consuming and costly.

Another alternative coping mechanism is to compensate the behavior of the device after completion of all of the processing steps.

SUMMARY OF THE INVENTION

The present invention is a means of delicately adjusting the orientation of features in completed MEMS devices, which may or may not already have silicon cover plates applied to protect mechanism integrity. The use of such method allows the trimming of modulation, bias and other dynamic behaviors of the MEMS devices after initial formation and installation within the device packaging.

The method of trimming in the present invention exploits the ability of film stresses, created by growing a film of different thermal expansion coefficient on the MEMS silicon substrate, to change the shape of the MEMS device. After the film is grown on the substrate, laser radiation is used to selectively remove a portion of the film, such that the remaining material will upset the balance of stresses on the member and cause it to take on a different shape. A laser radiation frequency is selected such that the radiation will transmit through the substrate but will be absorbed by the film, causing removal of the film by ablation. The extent to which the trimming effect occurs depends on the amount of material removal desired, the location from which the material is removed, and the sensitivity of the MEMS design to removal of the material.

According to one aspect of the invention, a compensation method for MEMS devices is provided, the method including modeling predetermined performance parameters of a MEMS device; manufacturing the MEMS device in a silicon substrate using conventional micro-machining techniques; growing an oxide film layer on one or more portions of the MEMS device determined to apply a physical stress effective for control of a performance parameter of the MEMS device; performing initial measurements of the performance parameter; irradiating the oxide film layer to remove a predetermined portion thereof; and optionally performing post-irradiation measurements of the performance parameter.

The irradiating of the oxide film layer is optionally repeated to remove an additional predetermined portion thereof until the performance parameter of interest is trimmed within predetermined limits.

BRIEF DESCRIPTION OF THE FIGURES

The foregoing aspects and many of the attendant advantages of this invention will become more readily appreciated as the same becomes better understood by reference to the following detailed description, when taken in conjunction with the accompanying drawings, wherein.

DESCRIPTION OF PREFERRED EMBODIMENTS

In the Figures, like numerals indicate like elements.

The present invention is a compensation method that provides for delicately adjusting an orientation of features in completed and operational MEMS devices, which may or may not already have silicon cover plates applied to protect mechanism integrity. The method of the invention permits the trimming of modulation, bias and other dynamic behaviors of MEMS devices after initial formation and installation within the device packaging.

The compensation method of the present invention exploits the ability of film stresses to change the shape of the MEMS device. Film stresses are created in the MEMS device by growing a film of material on the MEMS silicon substrate having a different thermal expansion coefficient from the MEMS silicon substrate. Such a film, grown on the MEMS substrate at elevated temperature, is highly stressed by the difference in expansion coefficient. After the film is grown on the substrate, laser radiation is used to selectively remove a portion of the stressed film, such that the remaining stressed film material upsets the balance of stresses on a member of the MEMS device and causes it to take on a different shape. The extent to which the balance of stresses is upset depends on the amount of material grown, the amount of material removed, the location from which the material is removed, and the sensitivity of the particular MEMS design to the material removal.

Figure 1:
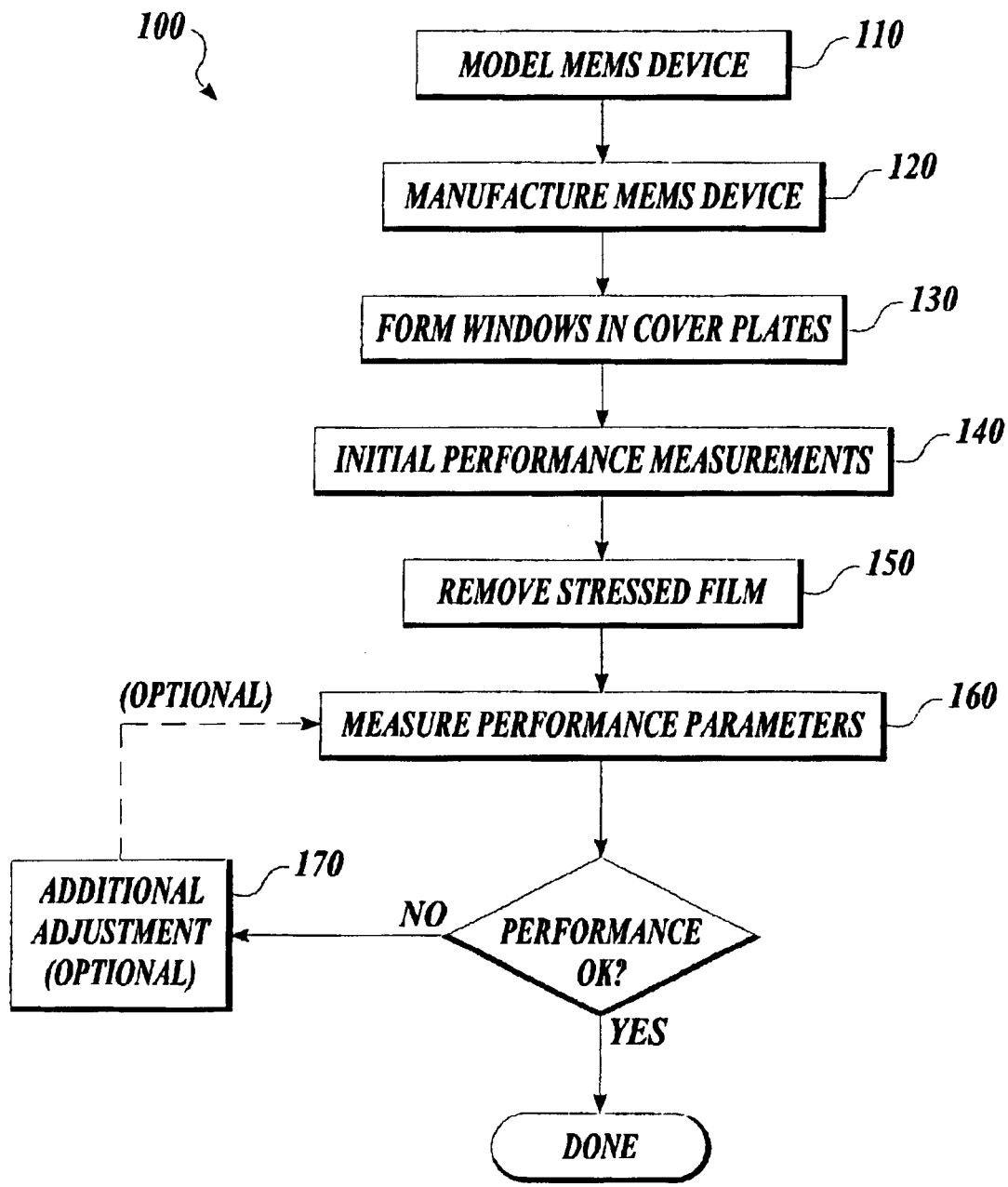
FIG. 1 illustrates one embodiment of the method of the invention.

FIG. 1 illustrates the method of the invention embodied in a flow diagram 100. Initially, the MEMS device is modeled 110 using a finite element analysis (FEA) program, such as ANSYS or another one of the well-known FEA programs. FEA is used to model the behavior of the dynamic system of the MEMS device and to determine the sensitivity of various performance parameters of interest to changes in the amount and location of an oxide film thermally grown on the surface of the MEMS device. The FEA model thus provides the areas on the surface of the MEMS device most effective for control of the performance parameters of interest. The FEA model also correlates the performance parameters with the location and amount of oxide film removed (or remaining).

The MEMS device is manufactured 120 according to conventional and well-know micro-machining techniques in a silicon substrate, and oxide films are conventionally grown on the MEMS device in the critical areas. For example, according to an embodiment of the invention wherein the MEMS device is made of silicon and the grown film is a silicon dioxide film, the oxide film is grown by inserting the MEMS device into an oxide diffusion furnace at elevated temperatures. The oxide films have a different expansion coefficient from the silicon substrate that causes a physical stress to be applied to the MEMS device at normal device operating temperatures.

Window apertures are formed 130 in protective cover plates at locations that correspond to the areas of the MEMS device having the oxide films, thereby providing access for removing portions of the oxide films. For example, window areas that have no oxide layer are formed in the area of the cover plate directly over the locations of the oxide films. For the embodiment in which the MEMS device is made of silicon and the grown film is silicon dioxide, the windows may be formed using photolithography to create the window shape and etched in a hydrofluoric acid (HF) or ammonium bifluoride etchant to clear the window area of silicon dioxide.

Initial performance measurements 140 are made of the performance parameters of interest, i.e., subject to trimming, and correlated with the location and amount of stressed film removal determined by the FEA. Such performance parameters include, for example, modulation, bias and other dynamic behaviors of the MEMS devices.

Appropriate amounts of the stressed film are removed 150 from appropriate locations on the surface of the MEMS device, as determined by correlation with the FEA model. For example, according to one embodiment of the invention, laser radiation is used to selectively remove a portion of the stressed film, such that the remaining stressed film appropriately upsets the balance of stresses on the member of the MEMS device and causes it to take on a different shape that results in the MEMS device exhibiting the performance parameters of interest within desired limits. A laser radiation frequency is selected such that the radiation is transmitted through the window material of the substrate but is absorbed by the thermally grown film, causing removal of the film by ablation. This permits the modification of interior features from outside the completely constructed and enclosed MEMS device assembly. When the MEMS device is made of silicon and the grown film is silicon dioxide, the radiation of choice is CO2 infrared radiation at a wavelength of 10.6 microns.

As discussed above, the extent to which the performance parameters are affected depends on the amount of material grown, the amount of film material removed, the target location from which the film material is removed, and the sensitivity of the MEMS design to the removal of film material from the target location. The amount of film material removed by the laser radiation is controlled by varying the laser power applied and the laser exposure area. Depending upon the sensitivity of the particular MEMS design to the film material removal and the limits on the performance parameters of interest, the compensation method of the invention may be operated as an uncontrolled, open-loop process and may be complete at this point.

According to the controlled embodiment of the invention diagrammed in FIG. 1, after exposure to the laser radiation, the performance parameters of interest are again measured 160. Optionally, additional adjustments are made 170 to account for part-to-part variations in the correlation with the FEA model. The measurement 160 and adjustment 170 may be repeated until predetermined performance characteristics are attained.

Figure 2:
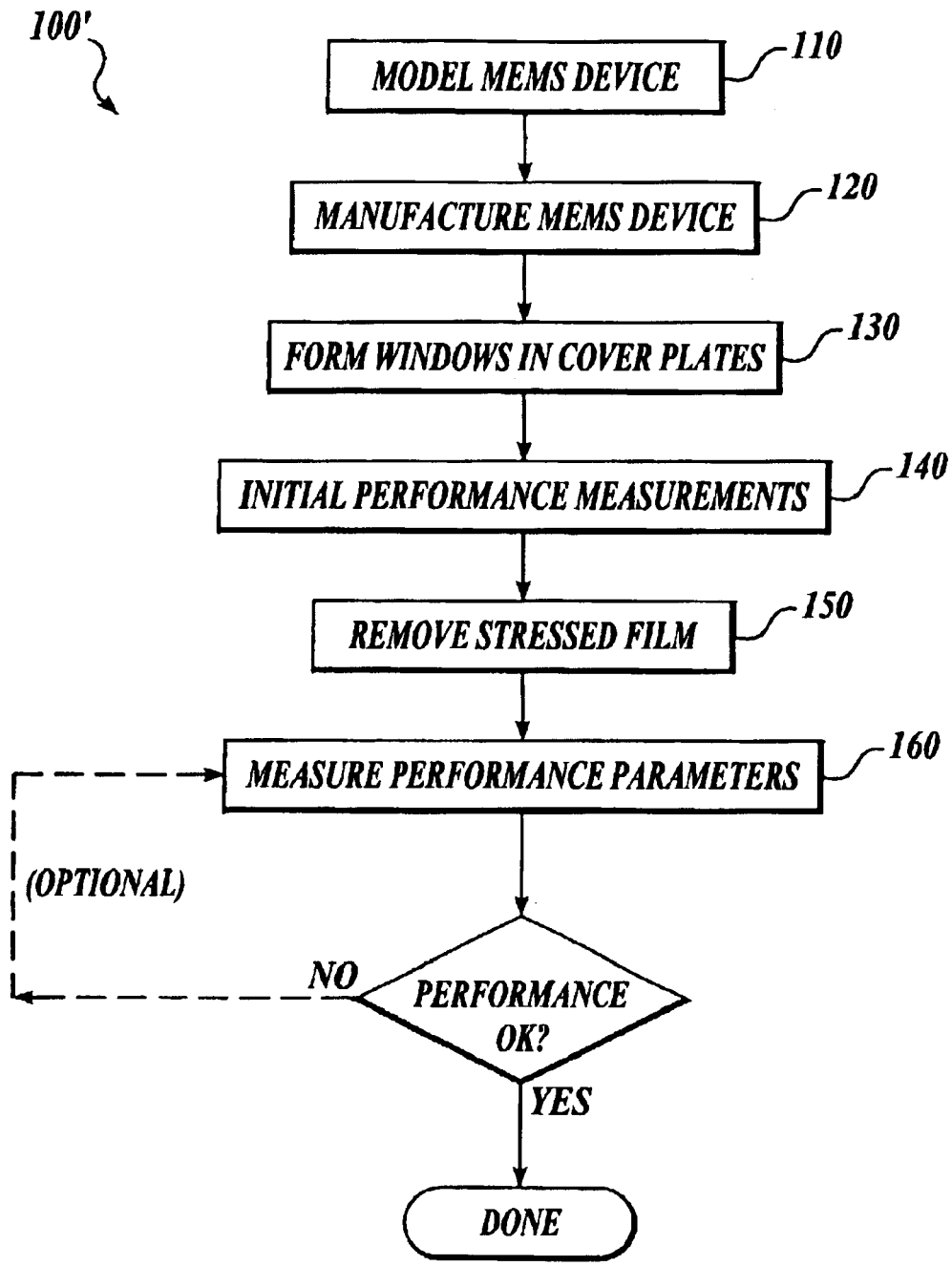
FIG. 2 illustrates a second embodiment of the method of the invention.

According to another embodiment 100' of the invention diagrammed in FIG. 2, the performance parameters of interest are measured 160 during exposure to the laser radiation 150, whereby performance is measured while the MEMS device is operating. Optionally, the performance measurements are used in a feed-back loop to trim the individual device performance to be within predetermined limits.

Of course, various combinations are possible of the embodiments illustrated in FIGS. 1 and 2, and such combinations are considered equivalents of the disclosed embodiments.

MEMS devices are known having one or more vibrating beam acceleration sensors formed in a silicon substrate. Such vibrating beam accelerometers are more fully described in each of U.S. Pat. No. 5,334,901, entitled VIBRATING BEAM ACCELEROMETER; U.S. Pat. No. 5,456,110, entitled DUAL PENDULUM VIBRATING BEAM ACCELEROMETER; U.S. Pat. No. 5,456,111, entitled CAPACITIVE DRIVE VIBRATING BEAM ACCELEROMETER; U.S. Pat. No. 5,948,981, entitled VIBRATING BEAM ACCELEROMETER; U.S. Pat. No. 5,996,411, entitled VIBRATING BEAM ACCELEROMETER AND METHOD FOR MANUFACTURING THE SAME; and U.S. Pat. No. 6,119,520, entitled METHOD FOR MANUFACTURING A VIBRATING BEAM ACCELEROMETER, all of which are assigned to the assignee of the present application and the complete disclosures of which are incorporated herein by reference. Such vibrating beam accelerometers have been fabricated from a body of semiconductor material, such as silicon, using MEMS techniques. Existing techniques for manufacturing these miniature devices are described in U.S. Pat. No. 5,006,487, entitled METHOD OF MAKING AN ELECTROSTATIC SILICON ACCELEROMETER, and U.S. Pat. No. 4,945,765, entitled SILICON MICROMACHINED ACCELEROMETER, both of which are assigned to the assignee of the present application and the complete disclosures of which are incorporated herein by reference.

Figure 3:
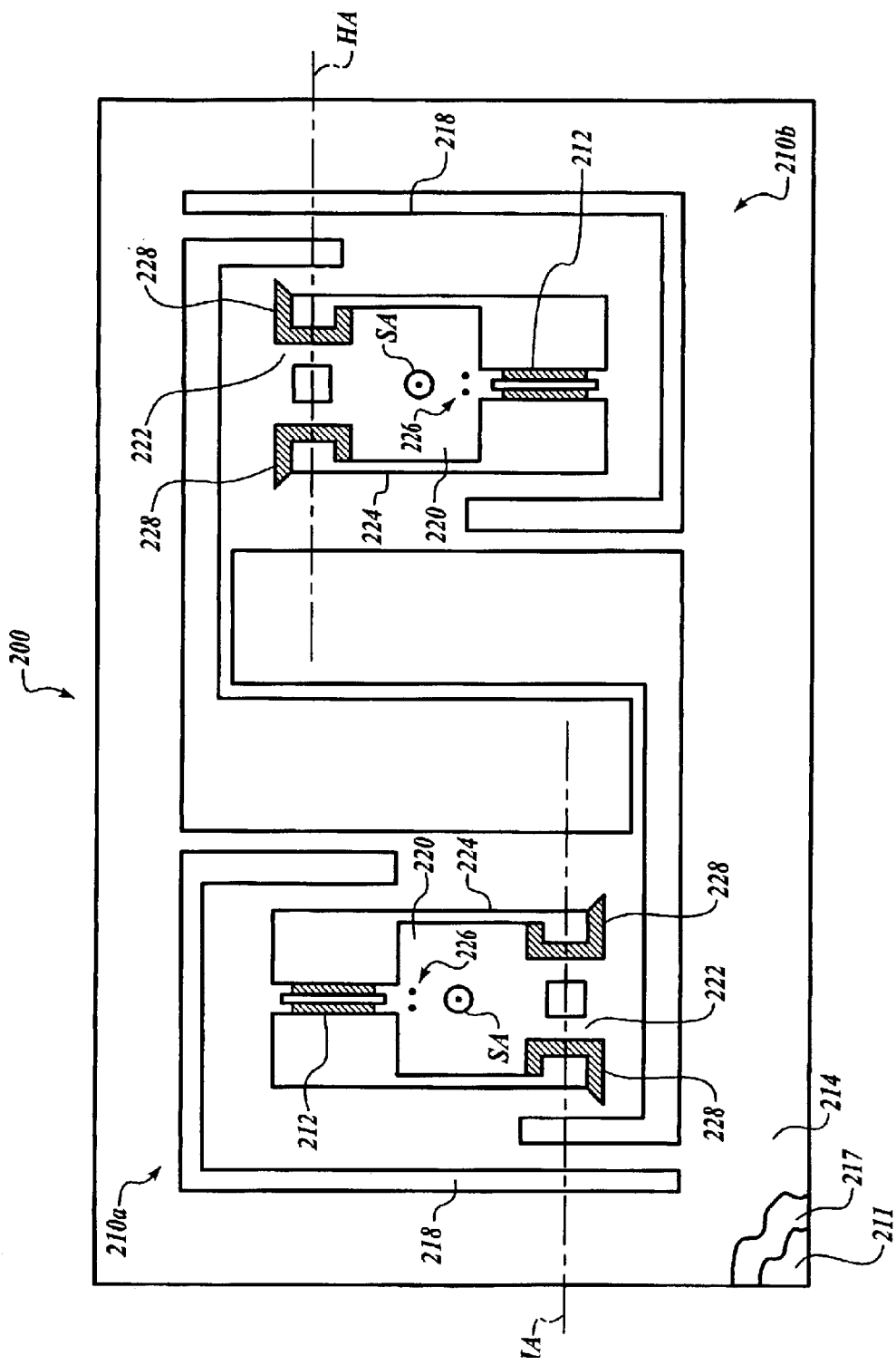
FIG. 3 is an illustration of the invention embodied as a MFMS device having silicon dioxide trimming material grown thereon.

FIG. 3 illustrates the invention embodied in a MEMS device 200 having two vibrating beam acceleration sensors 210a and 210b formed in a silicon substrate 211. Of course, the invention is equally applicable to any number of acceleration sensors 210 formed in the silicon substrate 211, all of which are considered equivalents. Examples of more complex versions of such accelerometers employing multiple vibrating beam transducers and methods of manufacturing the same are provided in each of the patents incorporated above.

Each acceleration sensor 210a and 210b is formed with a vibrating beam transducer 212 (shown as a dual vibrating beam transducer) in the substrate 211. The vibrating beam transducer 212 may be formed in an active layer 214 coupled to the surface of the substrate 211 through a thin insulating layer 217. Preferably, the substrate 211 and active layers 214

(if present) are made from a silicon or polysilicon material, and the insulating layer (if present) is a thin layer, e.g., about 0.1 to 10 micrometers, of oxide, such as silicon dioxide or another suitable insulating material. The substrate 211 includes at least one frame 218 and a proof mass 220 suspended from the frame 218 by one or more hinges or flexures 222 for rotation about an input axis HA, commonly known as the "hinge" axis, in response to an applied acceleration force along a sensitive axis SA.

The proof mass 220 is formed from the substrate 211 by etching a slot 224 through the substrate 211 and suitably etching around the flexures 222. The flexures 222 are preferably etched near or at the center of the substrate 211, i.e., substantially centered between the opposing upper and lower planar surfaces. Flexures 222 are formed using well-known time etching techniques, which entail precision timed etching from both surfaces to form thin flexure hinges. This arrangement provides an input axis HA, i.e., the axis about which the proof mass 220 rotates in response to an applied force, that extends substantially through the center of mass of the substrate 211, which reduces the skew of the input axis HA relative to the mass of the proof mass 220, thereby improving the accuracy of the accelerometer 210a, 210b. Flexures 222 are preferably spaced from each other along an edge of the proof mass 220 and define an effective hinge point centered therebetween. Alternatively, a single flexure (not shown) may be formed at the hinge point. Flexures 222 may be designed to limit S-bending. To this end, flexures 222 are formed to have a short length, or they each comprise a right circular optimized hinge. A pseudo right circular hinge may be formed by precision time etching along etch planes, as described in detail in above-incorporated U.S. Pat. No. 5,996,411, which also describes in detail that separate etching may also be performed to round the hinge geometry to form an ideal right circular hinge.

The vibrating beam transducer 212 and the appropriate electrical bonds 226 for coupling the transducer 212 to an oscillator circuit are formed on the active layer 214 by suitable etching techniques, such as reactive ion etching, anisotropic etching or another conventional etching technique. In one embodiment, openings (not shown) are formed in the insulating layer 217 to electrically couple electrical bonds 226 of the transducer 212 to the substrate 211 and to mechanically couple the transducer 212 to the proof mass 220 and an inner portion of the frame 218. The vibrating beam transducer 212 is thus electrically coupled to the oscillator circuit through electrodes 226. Alternatively, the electrical bonds 226 may be directly coupled to the drive and sense circuits (not shown). The remaining portions (not shown) of the active layer 214 may then be removed to minimize disturbances to the active components.

The vibrating beam transducer 212 includes a pair of beams which are driven by a well-known oscillator circuit, described below, to oscillate at their resonance frequency in the plane of the beams. Such transducers 212 are known as force-to-frequency transducers since a change in the force applied to the transducer will result in a change of the resonant frequency of the transducer. In particular, a tension force applied along an axis generally parallel to the beams will cause an increase of the resonant frequency, while a compression force will generally decrease the resonant frequency. The vibrating beam transducer 212 is mechanically coupled between the frame 218 and the proof mass 220 for detecting a force applied to the proof mass 220. An applied acceleration force along the sensitive axis SA rotates the proof mass 220 about the input axis HA. Such rotation subjects the vibrating beam transducer 212 alternatively to a tension or compression force, depending upon whether the input acceleration is positive or negative.

More detailed descriptions of the vibrating beam transducer 212 are provided in the patents incorporated above, but are not relevant to the present invention.

In FIG. 3, the invention is embodied in the MEMS device 200 as a film layer 228, such as a silicon dioxide film, having a different thermal expansion coefficient from the silicon substrate 211 upon which it is grown at elevated temperature. The film layer 228 is grown in an area of the structure of each accelerometer 210a, 210b that is determined by FEA modeling of the behavior of the dynamic system of the MEMS device 200 to be most effective for control of the performance parameters of interest, such as modulation, bias and other dynamic behaviors of the MEMS device 200. The FEA model has also correlated the performance parameters with the location and amount of oxide film layer 228 to be removed (or to remain).

As discussed above, the flexures 222 are formed in the body of the substrate 211 and are thus formed of silicon. The oxide film layer 228 is grown of a predetermined thickness in a predetermined area of each flexure 222 as a stressed film.

If the compensation of the performance parameters is performed on the MEMS device 200 before installation of the covers (shown in FIG. 4), initial measurements are made of the performance parameters of interest and correlated with the location and amount of stressed film removal determined by the FEA. Laser radiation is used to selectively remove a portion of the stressed oxide film layer 228, such that the remaining portion of the stressed oxide film layer 228 appropriately upsets the balance of stresses on each flexure 222 of the MEMS device 200 and causes it to take on a different shape that results in the MEMS device 200 exhibiting the performance parameters of interest within predetermined limits.

If the sensitivity of the particular MEMS device 200 to the film material removal is minimal and the limits on the performance parameters of interest are large, the compensation method of the invention may be operated as an uncontrolled, open-loop process and may be complete at this point. The covers are installed, and the MEMS device 200 is complete.

Figure 4:
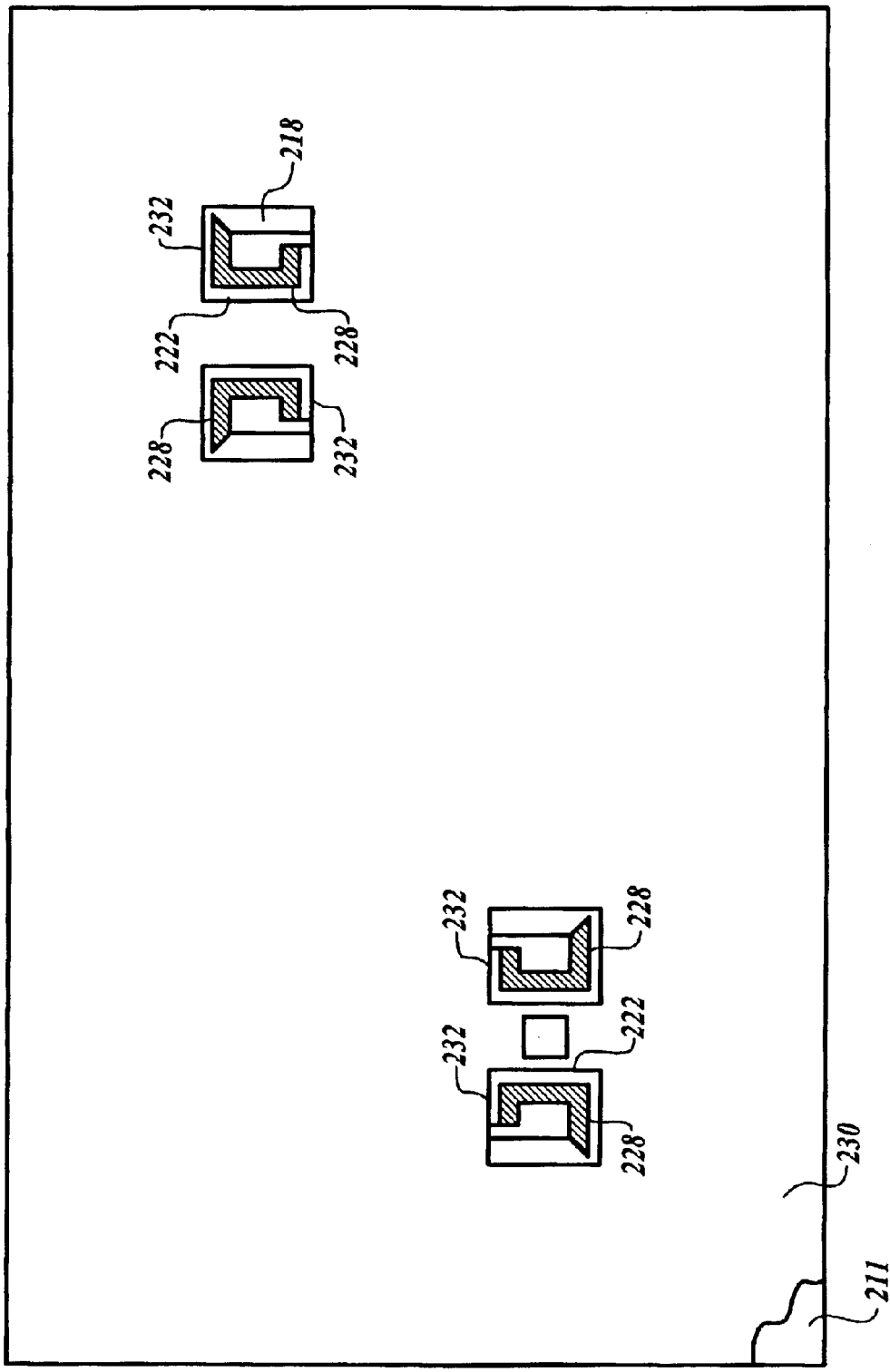
FIG. 4 illustrates one embodiment of an oscillation drive circuit useful with a vibrating beam transducer of the invention manufactured using the method of the invention.

FIG. 4 illustrates the compensation method of the invention embodied in an alternative compensated MEMS device 200. In FIG. 4, protective top and bottom cover plates 230 (only one shown) are installed over the micro-machined substrate 211 according to conventional assembly procedures. Windows 232 are formed as described above in the cover plates 230 in areas that correspond to the areas of the MEMS device 200 having the oxide film layers 228, thereby providing access for removing portions of the oxide film layers 228.

Initial measurements are made of the performance parameters of interest and correlated with the location and amount of stressed oxide film layers 228 removal determined by the FEA.

The MEMS device 200 is fixed in suitable tooling providing a predetermined geometric relationship between the focus point of the laser and the structure of the MEMS device 200 that will have a suitable portion of the stressed oxide film layers 228 removed, i.e., the flexures 222. Laser radiation is used selectively to remove a predetermined portion of the stressed oxide film layer 228, such that the remaining portion of the stressed oxide film layer 228 appropriately upsets the balance of stresses on the flexures 222 and causes them to take on a different shape that results in the MEMS device 200 exhibiting the performance parameters of interest within predetermined limits.

After exposure to the laser radiation, the performance parameters of interest are again measured. Optionally, additional adjustments are made to account for part-to-part variations in the correlation with the FEA model. The measurement and adjustment may be repeated until predetermined performance characteristics are attained. The compensation method of the invention is thus practiced in a closed-loop manner to achieve the desired performance of the MEMS device 200 within predetermined limits.

According to another embodiment of the invention, the performance parameters of interest are measured during exposure to the laser radiation, whereby performance is measured while the MEMS device 200 is operating. Optionally, the performance measurements are used in a dynamic feed-back loop to trim performance of the individual MEMS device 200 to be within predetermined limits.

Of course, the MEMS device 200 can be embodied in other devices than that illustrated in FIGS. 3 and 4, and such other devices are considered equivalents of the disclosed embodiments.

Figure 5:
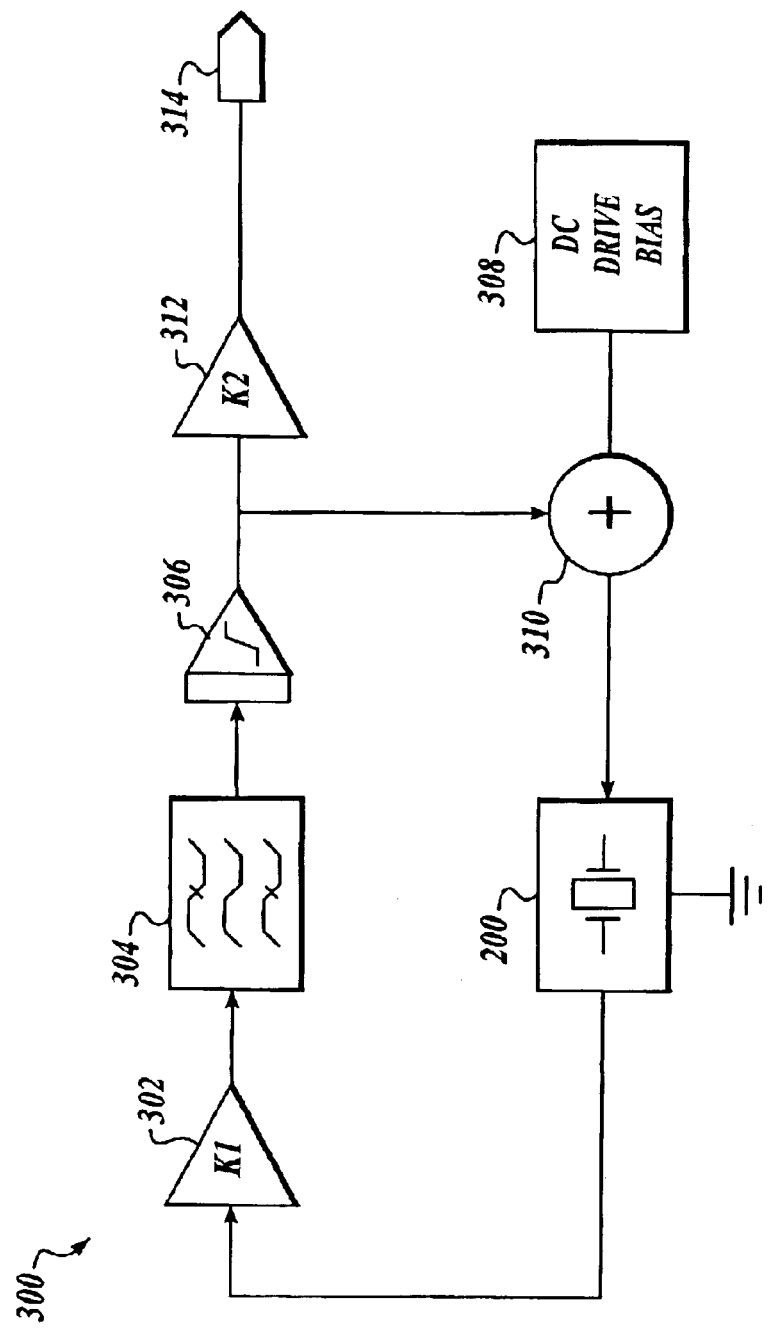
FIG. 5 illustrates one embodiment of a representative oscillation drive circuit useful with the MEMS device of the invention in which the vibrating beams function as a resonator.

FIG. 5 illustrates one embodiment of a representative oscillation drive circuit 300 useful with the MEMS device 200 of the invention in which the vibrating beams 212 function as a resonator. A transimpedance amplifier 302 converts a sense current received from the vibrating beams 212 to a voltage. This voltage is filtered by a bandpass filter 304, which reduces noise, and its amplitude is controlled by an amplitude limiter 306. The resulting signal is combined with the output or DC bias voltage from a DC source 308 in a summing junction 310. The DC bias voltage generates a force between the electrodes 226 and the beams 212. The signal from the amplitude limiter 306 modulates this force, which causes the beams 212 to vibrate laterally at their resonant frequency. This lateral beam motion, in turn, generates the sense current. An output buffer 312 isolates the oscillator from external circuitry connected to an output 314 of oscillation circuit 300. The gain in oscillation circuit 300 sustains the oscillation of beams 212.

Obviously, many modifications and variations of the present invention are possible in light of the above teachings. Thus, it is to be understood that, within the scope of the appended claims, the invention may be practiced otherwise than as specifically described above.

What is claimed is:

1. A micro-machined electromechanical sensor (MEMS) device, comprising:
    a substrate having micro-machined therein a sensor device;
    an oxide layer formed over protions of the substrate correlated to one or more performance parameters of the sensor device, the oxide layer having a thermal expansion coefficient different from a thermal expansion coefficient of the substrate; and
    a protective cover plate installed on opposite sides of the substrate, one or more of the cover plates having a window area formed in an area corresponding to the oxide layer.

2. The device recited in claim 1 wherein the different thermal expansion coefficient of the oxide layer from the substrate applies a physical stress to the substrate.

3. The device recited in claim 1 wherein the substrate is silicon and the oxide layer is film of silicon dioxide.

4. The device recited in claim 3 wherein the protective cover plates are silicon.

5. The device recited in claim 1 wherein the oxide layer is selected to absorb a laser radiation that is transmitted through the window area.

6. The device in claim 1 wherein the MEMS device is a hinged sensor device, and the oxide layer is formed over portions of hinges formed in the substrate.

7. A micro-machined electromechanical sensor (MEMS) device, comprising:
    a frame formed in a substrate of a first material having a first coefficient of thermal expansion;
    a proof mass formed in the substrate and suspended from the frame by one or more flexures, the flexures formed in the substrate;
    a top and a bottom cover plate disposed on opposite sides of the substrate, one of the top and bottom cover plates having a window area formed therein and aligned with the one or more flexures; and
    an oxide film formed over a portion of the one or more flexures, the oxide film having a second coefficient of thermal expansion different from the first coeddicient of the thermal expansion.

8. The device recited in claim 7, further comprising a vibrating beam transucer coupled between the proof mass and the frame.

9. The device recited in claim 7, wherein the oxide film is selected to absorb a radiation frequency that is transmitted through the window area.

10. The device recited in claim 7 wherein the oxide film is disposed at a location and in an amount selected to adjust one or more performance parameters of the device.

11. The device recited in claim 10 wherein the oxide film disposed at a location and in an amount selected to adjust one or more performance parameters of the device is a remaining portion of a larger amount of the oxide film remianing after removal of an original portion of the oxide film.

12. A micro-machined electromechanical acceleration sensor, comprising:
    a substantially planar silicon substrate having one or more frames formed therein;
    one or more pendulous proof masses formed in the substrate, one of the one or more pendulous proof masses suspended from each of the one or more frames;
    one or more flexures formed in the substrate and suspending the one of the one or more pendulous proof masses from the frames;
    a silicon dioxide film thermally grown over at least a portion of each of the one or more flexures and being partially removed therefrom; and
    a pair of silicon cover plated disposed on opposite surfaces if the substrate, one or more of the cover plates having a window portion formed therein directly opposite the portion of each of the one or more flexures the silicon dioxide film thermally grown therefor.

13. The sensor recited in claim 12 wherein the silicon dioxide film is disposed over a portion of each of the one or more flexures correlated to a performance parameter of the sensor.

14. The sensor recited in claim 12 wherein the silicon dioxide film is disposed in an amount and at a location correlated to a performance parameter of the sensor.

15. The sensor recited in claim 12 wherein the amount and location of the silicon dioxide film is correlated to a performance parameter of the sensor according to a finite element analysis model.

* * * * *